US008618662B1

(12) United States Patent
Derderian et al.

(10) Patent No.: US 8,618,662 B1
(45) Date of Patent: Dec. 31, 2013

(54) DEVICES CONTAINING CARBON NANOMATERIAL ELECTRICAL INTERCONNECTS OVERCOATED WITH METAL NITRIDE FILMS AND METHODS FOR PRODUCTION THEREOF

(75) Inventors: Garo J. Derderian, Manassas, VA (US); Jonathan W. Ward, San Jose, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 13/398,771

(22) Filed: Feb. 16, 2012

(51) Int. Cl.
*H01L 21/44* (2006.01)

(52) U.S. Cl.
USPC .................. 257/751; 257/763; 257/E23.168; 977/742

(58) Field of Classification Search
USPC .................................. 257/751, 763; 977/742
See application file for complete search history.

(56) References Cited

U.S. PATENT DOCUMENTS

2007/0267693 A1* 11/2007 Chien et al. ................ 257/343
2008/0207006 A1* 8/2008 Martin et al. ............... 438/763

OTHER PUBLICATIONS

C.C. Wang, et al., "Electrical Properties of High-Temperature Oxides, Borides, Carbides, and Nitrides," Journal of Materials Science 30 (1995), pp. 1627-1641.
M.H. Tsai, et al., "Metalorganic Chemical Vapor Deposition of Tungsten Nitride for Advanced Metallization," Appl. Phys. Lett. 68 (10), Mar. 4, 1996, pp. 1412-1414.
M.H. Tsai, et al., "Metalorganic Chemical Vapor Deposition of Tantalum Nitride by Tertbutylimidotris(diethylamido(tantalum for Advanced Metallization," Appl. Phys. Lett. 67 (8), Aug. 21, 1995, pp. 1128-1130.

* cited by examiner

*Primary Examiner* — Alexander Ghyka
(74) *Attorney, Agent, or Firm* — McDermott Will & Emery LLP (57) ABSTRACT

Metal nitride coatings containing carbon can be either electrically conductive or substantially non-conductive depending on the degree to which they have been exposed to an oxidative environment. Substantially non-conductive metal nitride coatings can be used as protective layers in electrical devices. Particularly in an electrical device containing carbon nanomaterials, the metal nitride coatings can be used to mask the device's operational characteristics. Such devices can contain an electrical interconnect containing a carbon nanomaterial and a substantially non-conductive coating on the carbon nanomaterial. The substantially non-conductive coating can contain at least one substantially non-conductive metal nitride layer and at least some carbon. Methods for making such devices and metal nitride coatings are also described herein.

11 Claims, 8 Drawing Sheets

DEVICES CONTAINING CARBON NANOMATERIAL ELECTRICAL INTERCONNECTS OVERCOATED WITH METAL NITRIDE FILMS AND METHODS FOR PRODUCTION THEREOF

CROSS-REFERENCE TO RELATED APPLICATIONS

This application is related to U.S. patent application Ser. No. 13/220,592, filed Aug. 29, 2011, which is incorporated herein by reference in its entirety.

STATEMENT REGARDING FEDERALLY SPONSORED RESEARCH OR DEVELOPMENT

Not applicable.

FIELD OF THE INVENTION

The present invention generally relates to devices containing carbon nanomaterials, and, more particularly, to devices whose operational state can be masked without altering the operational characteristics of the device.

BACKGROUND

Tampering of industrial devices, particularly in the electronics industry, represents an ongoing challenge for manufacturers. As used herein, the terms "tamper," "tampering," and grammatical equivalents thereof will refer to any unauthorized use, access or investigation of a device, whether malicious or not. At a minimum, tampering can sometimes result in the improper operation of or damage to a device. In other cases, a device can be modified in a manner that makes the device operate in a way that is inconsistent with that which its manufacturer intended. Imparting tamper resistance to a device can also lessen the likelihood that unauthorized personnel can perform maintenance on the device. An even more significant concern for manufacturers is the unwanted evaluation of a device and its components for reverse engineering or other malicious purposes. In such cases, a manufacturer may wish to mask the true operational characteristics of a device in order to prevent loss of valuable corporate knowledge. It is generally not necessary that an anti-tampering system alert the observer that an anti-tampering system is in place.

Although a variety of systems to prevent tampering have been implemented in industrial devices, there is still an ongoing need to develop new anti-tampering paradigms. The present invention satisfies the foregoing need and provides related advantages as well.

SUMMARY

In some embodiments, devices described herein include an electrical interconnect containing a carbon nanomaterial and a substantially non-conductive coating on the carbon nanomaterial. The substantially non-conductive coating contains at least one substantially non-conductive metal nitride layer and at least some carbon.

In some embodiments, methods described herein include providing a device containing an electrical interconnect with a carbon nanomaterial, depositing a first conductive coating on the carbon nanomaterial, and exposing the first conductive coating to an oxidative environment for a sufficient length of time to form a substantially non-conductive coating. The first conductive coating contains at least one conductive metal nitride layer and at least some carbon. The substantially non-conductive coating still contains at least some carbon.

In some embodiments, methods described herein include performing layer-by-layer deposition of a coating on a growth substrate, where the coating is deposited by thermal chemical vapor deposition of a metal-organic precursor and contains two or more metal nitride layers and at least some carbon; treating some, but not all, of the metal nitride layers to remove at least a portion of the carbon therefrom; and exposing the coating to an oxidative environment for a sufficient length of time for any untreated layers to become substantially non-conductive.

In some embodiments, metal nitride-coated substrates can be prepared by a process that includes performing layer-by-layer deposition of a coating on a growth substrate, where the coating is deposited by thermal chemical vapor deposition of a metal-organic precursor and contains two or more metal nitride layers and at least some carbon; treating some, but not all, of the metal nitride layers to remove at least a portion of the carbon therefrom; and exposing the coating to an oxidative environment for a sufficient length of time for any untreated layers to become substantially non-conductive.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

The present disclosure is directed, in part, to devices containing a carbon nanomaterial and a substantially non-conductive coating on the carbon nanomaterial that contains a metal nitride and at least some carbon. The present disclosure is also directed, in part, to methods for making such devices. The present disclosure is also directed, in part, to methods for making a metal nitride coating on a substrate.

Metal nitrides are commonly used in the electronics industry as a diffusion barrier to prevent intermixing between two or more layers of an electronic device. Metal nitrides can also be used in electronics manufacturing as a thin adhesion layer on which can be deposited other materials that do not adhere well to a particular substrate. An illustrative metal nitride that can be used in this regard is titanium nitride (TiN). In the disclosure that follows, it is to be recognized that any specific embodiment utilizing titanium nitride can be practiced in a like manner using other metal nitrides that have similar properties. As described hereinafter, other materials that have like properties can be used as well.

Pristine titanium nitride is a hard, dense, refractory substance having good electrical conductivity. When used as a diffusion barrier or adhesion layer in an electronic device, electrical current can continue flowing due to its electrical conductivity. Pristine titanium nitride can be deposited at high temperatures by sputtering or chemical vapor deposition of inorganic precursors.

Titanium nitride can also be deposited at lower temperatures by thermal chemical vapor deposition of metal-organic precursor. Suitable metal-organic precursors for thermal chemical vapor deposition of titanium nitride can include, for example, tetrakis-(dimethylamido)titanium (TDMAT) and tetrakis-(diethylamido)titanium (TDFAT). Other suitable metal-organic precursors can be envisioned by one having ordinary skill in the art. Furthermore, it is to be recognized that other metal nitrides having properties similar to titanium nitride can be prepared in a like manner when other suitable metal-organic precursors are used.

When titanium nitride and other metal nitrides are deposited by thermal chemical vapor deposition of a metal-organic precursor, the deposited material can be heavily doped with carbon residues, typically originating from the organic ligand of the metal-organic precursor. These carbon residues can be removed from the deposited metal nitride by treatment with a plasma, such as, for example, a hydrogen, nitrogen, or ammonia plasma, and such treatment is common in the electronics industry. Ordinarily, it is important to remove carbon residues from the deposited metal nitride, since the material can otherwise be susceptible to gradual oxidation. Gradual oxidation can convert the initially conductive metal nitride into a substantially non-conductive state. Since typical uses of metal nitrides in the electronics industry rely upon electrical conductivity, a non-conductive metal nitride would be unsuitable for most common electronics applications.

In contrast to the conventional uses of titanium nitride and other metal nitrides in the electronics industry, embodiments described here make use of titanium nitride and other metal nitrides that have not had carbon removed therefrom and that have been deliberately exposed to an oxidative environment such that they become substantially non-conductive. After becoming substantially non-conductive, metal nitrides (e.g., as a coating) can provide effective electrical and physical isolation of electrical interconnects and other electronic components within a device. This can lessen the need for other hermetic sealing techniques.

Substantially non-conductive metal nitride coatings can be particularly advantageous when used in combination with devices containing carbon nanomaterials. As one of ordinary skill in the art will understand, carbon nanomaterials can be electrically conductive and can form electrical circuits and other types of electrical interconnects in a device, even when low quantities of the carbon nanomaterials are present. Further, when utilized in a two-terminal electrical device or like configuration, carbon nanomaterials can be cycled between a high conductivity state (ON state) and a low conductivity state (OFF state) through application of appropriate magnitude voltage pulses, thereby forming the basis for a switch or an electronic memory element.

The thermal chemical vapor deposition conditions used for depositing metal nitride coatings are generally non-damaging to carbon nanomaterials. However, the plasma treatment used to remove carbon from metal nitride coatings can sometimes be damaging to carbon nanomaterials, thereby rendering the carbon nanomaterials non-conductive, if the coatings are sufficiently thin. Thus, use of conductive metal nitride coatings with carbon nanomaterials can be problematic. Substantially non-conductive metal nitride coatings are believed to present no such issues and can present particular advantages, as discussed hereinafter. Substantially non-conductive metal nitride coatings can protect carbon nanomaterials from environmental degradation and physical damage when present in electrical devices. They can also protect the carbon nanomaterials from damage during further electrical device processing, such as deposition of additional layers in a semiconductor device. In addition, substantially non-conductive metal nitride coatings can provide electrical isolation for carbon nanomaterials in a device without the risk of electrical shorting. It is to be recognized that the foregoing benefits can also be realized when substantially non-conductive metal nitride coatings are used in conventional electrical devices not containing carbon nanomaterials.

An even more significant advantage can be realized when substantially non-conductive metal nitride coatings that contain carbon are used in combination with devices containing carbon nanomaterials. Specifically, the metal nitride coating can be used to mask the operational principles of the device. By including a carbon-containing metal nitride coating in a device containing carbon nanomaterials, the true locations of carbon nanomaterials can be obscured by the carbon background of the metal nitride coating. The inability to locate or even confirm the presence of carbon nanomaterials, either visually or spectroscopically, can prevent electrical components and conduction pathways beneath the metal nitride coating from being observed. Due to the small quantities of carbon nanomaterials typically needed for electronics applications, visual or spectroscopic observation of a carbon nanomaterial-containing electrical device having a metal nitride coating can fail to show the presence of carbon nanomaterials beneath the metal nitride coating.

The ability to mask the presence and/or location of carbon nanomaterials within a device can be advantageous with respect to anti-tampering applications. Without being able to locate, or even confirm the presence of, carbon nanomaterials, it can be much more difficult to reverse engineer or alter the operational principles of an electrical device. As an additional level of protection, dummy electrical connections, components, circuits, and the like can be included in the electrical devices. With no effective way to determine if a carbon nanomaterial is present in a given location, an observer has no conclusive way to ascertain which electrical connections and components are live and which are dummy connections and components.

As a further advantage of the embodiments described herein, a conductive metal nitride coating can be deposited on the substantially non-conductive metal nitride coating. The conductive metal nitride coating can be formed by removing at least some carbon from the outer regions of a carbon-containing metal nitride coating before the coating becomes non-conductive. Alternately, a carbon-free metal nitride coating can be formed by more rigorous deposition techniques (e.g., sputtering), where the carbon-containing metal nitride coating can protect the overcoated carbon nanomaterial from the more rigorous deposition conditions. The carbon-containing metal nitride coating can also help protect the overcoated carbon nanomaterial during deposition of an oxide layer during further electronic device processing. By depositing a conductive metal nitride coating over the substantially non-conductive metal nitride coating, a device can be produced that is physically identical, from outward appearances, to conventionally produced electronic devices containing a metal nitride diffusion barrier. Thus, such devices can beneficially be further assembled and processed by conventional electronics manufacturing techniques.

As used herein, the term "electrical device" refers to any entity that is configured to conduct electrical current. Electrical devices can include, for example, electronic components (e.g., field programmable gate arrays), circuit boards, circuits (e.g., analog and/or digital circuits), two-terminal devices (including two-terminal switches and memory devices, for example), three-terminal devices (e.g., field effect transistors), and the like.

As used herein, the term "electrical interconnect" refers to any electrical flow pathway connecting a first location and a second location that utilizes a carbon nanomaterial as the electrical conduction medium. Electrical interconnects can include, for example, patterned carbon nanomaterials, carbon nanomaterial fabrics, single- or multi-layered carbon nanomaterials, and the like. That is, an electrical interconnect can form a conductive trace between a first location and a second location.

As used herein, the term "substantially non-conductive" refers to a level of resistivity necessary to provide electrical isolation to carbon nanomaterials within an electrical device. A material will also be considered to be substantially non-conductive when it fails to establish an electrical conduction pathway between a first location and a second location. In some embodiments, a material will be considered to be substantially non-conductive, when applied as a coating, if its sheet resistivity is at least about 1000 ohms/square. In other embodiments, a material will be considered to be substantially non-conductive, when applied as a coating, if its sheet resistivity is at least about 2000 ohms/square. In still other embodiments, a material will be considered to be substantially non-conductive, when applied as a coating, if its sheet resistivity is at least about 3000 ohms/square. In some embodiments, a substantially non-conductive material, when applied as a coating, can have a sheet resistivity between about 1000 ohms/square and about 1,000,000 ohms/square. In some embodiments, a substantially non-conductive material, when applied as a coating, can have a sheet resistivity between about 1000 ohms/square and about 5000 ohms/square. In some embodiments, a substantially non-conductive material, when applied as a coating, can have a sheet resistivity between about 1000 ohms/square and about 2000 ohms/square, or between about 2000 ohms/square and about 3000 ohms/square, or between about 3000 ohms/square and about 4000 ohms/square, or between about 4000 ohms/square and about 5000 ohms/square, or between about 2000 ohms/square and about 4000 ohms/square, or between about 2000 ohms/square and about 5000 ohms/square, or between about 3000 ohms/square and about 5000 ohms/square. One of ordinary skill in the art, with the benefit of this disclosure, will be able to recognize a suitable level of resistivity needed to provide a desired degree of electrical isolation for a given device and application thereof.

As used herein, the term "conductive" refers to a material that is not substantially non-conductive.

As used herein, the terms "dummy electrical interconnect" or "dummy electrical component" refer to a structure that physically resembles a true (live) electrical interconnect or electrical component but is otherwise inoperative. For example, a dummy electrical interconnect or component can contain all the elements of a working electrical interconnect or component but lack a carbon nanomaterial.

In the description of the embodiments that follows, carbon nanomaterials can include, for example, carbon nanotubes, graphene, amorphous carbon, and any combination thereof. In general, any carbon nanomaterial that is conductive can be used in accordance with the embodiments described herein. It is to be understood that any specific embodiment described herein using a particular carbon nanomaterial can be practiced in a like manner using a different conductive carbon nanomaterial, if desired. In some embodiments, electrically conductive organic molecules can be considered to be a carbon nanomaterial. Such electrically conductive organic molecules can be used in place of or in combination with other carbon nanomaterials.

Likewise, in the description of the embodiments that follows, metal nitrides can include, for example, titanium nitride, tantalum nitride, tungsten nitride, and any combination thereof. In some embodiments, the metal nitride can be titanium nitride. In general, any metal nitride that can be deposited as or converted to a substantially non-conductive coating containing at least some carbon, where the deposition conditions are substantially non-damaging for carbon nanomaterials, can be used in accordance with the present embodiments. For example, thermal chemical vapor deposition of a metal-organic precursor can be used in some embodiments to deposit the metal nitride. A brief description of this process follows below. It is to be understood that any specific embodiment described herein using a particular metal nitride (e.g., titanium nitride) can be implemented in a like manner using an alternative metal nitride or other material having like properties, if so desired. More generally, other materials that can be deposited as or converted to a substantially non-conductive coating that contains at least some carbon, where the deposition conditions are substantially non-damaging to carbon nanomaterials, can be used in place of or in combination with a metal nitride, if desired. One having ordinary skill in the art with the benefit of this disclosure will be able to choose a particular metal nitride or metal nitride replacement and deposition method therefore for a given application. In some embodiments, suitable alternatives for metal nitrides can include, for example, metal carbides and metal borides containing some carbon.

In some embodiments, devices described herein can include an electrical interconnect containing a carbon nanomaterial and a substantially non-conductive coating on the carbon nanomaterial, where the substantially non-conductive coating can contain at least one substantially non-conductive metal nitride layer and at least some carbon.

In the embodiments described herein, the electrical interconnect can take on various forms. In some embodiments, the electrical interconnect can be in the form of a carbon nanomaterial trace that establishes an electrical conduction pathway between a first location and a second location. For example, in such embodiments, a carbon nanomaterial electrical interconnect can be patterned to establish electrical conductivity between various electronic components (i.e., be part of an electrical circuit). As noted above, by coating such an electrical interconnect with a substantially non-conductive metal nitride coating, such as those described herein, the connectivity of the various electronic components cannot be readily observed. In some embodiments, the electrical interconnect can be in the form of a two-terminal or three-terminal electrical device, where the carbon nanomaterial is disposed between a first electrode and a second electrode. As described above, such devices can constitute a switch or a memory element depending upon whether the carbon nanomaterial is in a high conductivity state or a low conductivity state. Not only can a substantially non-conductive metal nitride coating effectively mask the presence of a carbon nanomaterial between electrodes, but it can also mask whether the carbon nanomaterial is presently in a high conductivity state or a low conductivity state. That is, it can be difficult for an observer to determine whether a two-terminal device is in an ON or an OFF state at a particular time during operation.

In various embodiments, the substantially non-conductive coating of metal nitride can include at least one metal nitride layer. In some embodiments, the substantially non-conductive coating of metal nitride can be formed by thermal chemical vapor deposition of a metal-organic precursor, where at least some carbon is deposited in the metal nitride layer during the deposition process. The metal nitride layer can be either substantially non-conductive as-deposited or subsequently converted to a substantially non-conductive state (e.g., by exposure to an oxidative environment). In some embodiments, the thickness of the coating can be increased by repeating the deposition process multiple times. That is, layer-by-layer deposition can be used to increase the thickness of the substantially non-conductive coating of metal nitride. In some embodiments, the substantially non-conductive coating can include one metal nitride layer. In other embodiments, the substantially non-conductive coating can include two metal nitride layers, or three metal nitride layers, or four metal nitride layers, or five metal nitride layers, or six metal nitride layers, or seven metal nitride layers, or eight metal nitride layers, or nine metal nitride layers, or ten metal nitride layers. The thickness of each layer can be determined by altering the deposition conditions and the deposition time.

Depending upon the number of metal nitride layers present, the substantially non-conductive coating of metal nitride can have a wide range of thicknesses. In some embodiments, the substantially non-conductive coating can have a thickness of at least about 100 Å. In some embodiments, the substantially non-conductive coating can have a thickness of at least about 500 Å. In still other embodiments, the substantially non-conductive coating can have a thickness ranging between about 500 Å and about 1000 Å.

In the embodiments described herein, various amounts of carbon can be present in the substantially non-conductive coating of metal nitride. As one of ordinary skill in the art will recognize, an amount of deposited carbon can be at least partially dependent on the deposition conditions and the metal-organic precursor used, and one of ordinary skill in the art will understand how to adjust various parameters to produce a desired amount of carbon deposition. When it is desired to use the deposited carbon to mask the presence of a carbon nanomaterial in a device, the amount of carbon should be sufficient to effectively mask the presence of the carbon nanomaterial to various assay techniques (e.g., surface and spectroscopic assay techniques). Illustrative surface and spectroscopic assay techniques that can be used to probe for carbon nanomaterials on a surface can include, for example, Focused Ion Beam, Scanning Electron Microscopy, Transmission Electron Microscopy, Energy Dispersive Spectroscopy, X-Ray Photoelectron Spectroscopy, X-Ray Fluorescence Spectroscopy, X-Ray Diffraction, Auger Electron Spectroscopy, and the like. For the quantities of carbon nanomaterials employed in a typical electrical device, the amount of signal increase due to the presence of the carbon nanomaterials is expected to be relatively inconsequential when compared to background carbon, thereby making identification and location of the carbon nanomaterials difficult.

In some embodiments, the substantially non-conductive coating can contain an amount of carbon that is at least about ten times that which is present in the carbon nanomaterial that it overcoats. In some embodiments, the substantially non-conductive coating can contain an amount of carbon that is at least about five times that which is present in the carbon nanomaterial that it overcoats. In some embodiments, the substantially non-conductive coating can contain an amount of carbon that is at least about three times that which is present in the carbon nanomaterial that it overcoats. In some embodiments, the substantially non-conductive coating can contain an amount of carbon that is at least about two times that which is present in the carbon nanomaterial that it overcoats. In some embodiments, an amount of carbon in the substantially non-conductive coating can be at least about 4% by mass of the coating, or at least about 5% by mass of the coating, or at least about 6% by mass of the coating, or at least about 7% by mass of the coating, or at least about 8% by mass of the coating, or at least about 9% by mass of the coating, or at least about 10% by mass of the coating.

In some embodiments, the rate at which an as-deposited conductive coating of metal nitride is converted into a substantially non-conductive coating can be accelerated. As previously described, exposure of a carbon-containing metal nitride coating to an oxidative environment can result in the conversion of a conductive coating into a substantially non-conductive coating. Generally, exposure to atmospheric oxygen can affect this conversion over a period of about one day to about four days. When it is desired to accelerate the rate of conversion, an oxygen plasma can be used. For example, during layer-by-layer deposition of a metal nitride coating, an oxygen plasma can be applied after at least some of the layer depositions to convert the metal nitride into a substantially non-conductive state. When using an oxygen plasma, the lower layers of metal nitride can protect the carbon nanomaterial from degradation by the plasma. Subsequent layers of metal nitride can be deposited after applying the oxygen plasma in order to increase the coating thickness.

In some embodiments, the devices can further include a conductive coating disposed on the substantially non-conductive coating, where the conductive coating can include at least one metal nitride layer. In some embodiments, the conductive coating can be deposited during the same layer-by-layer deposition process used to deposit the substantially non-conductive coating. Specifically, once the substantially non-conductive coating has been deposited to a desired thickness, the deposition conditions can be altered such that the outer layer(s) of metal nitride (e.g., the layer(s) of metal nitride located more distant from the carbon nanomaterial) remain(s) conductive when exposed to an oxidative environment. For example, once a desired thickness of the substantially non-conductive coating has been reached, layer-by-layer deposition can continue, but a plasma (e.g., a hydrogen plasma, a nitrogen plasma, or an ammonia plasma) can be applied after at least some of the layer depositions such that at least some carbon is removed and the metal nitride remains conductive. In such embodiments, the lower layers of metal nitride can again protect the carbon nanomaterial from degradation by the plasma.

In some embodiments, the metal nitride of the substantially non-conductive coating and the metal nitride of the conductive coating can be the same metal nitride. For example, titanium nitride can be used to form a substantially non-conductive coating according to the description above, and plasma-treated titanium nitride can be used to form a conductive coating on the substantially non-conductive coating. In such embodiments, the combination of the substantially non-conductive coating and the conductive coating can be considered to be a single gradient coating, where a concentration of carbon is highest in the lower portions of the coating nearest the carbon nanomaterial. In other embodiments, the metal nitride of the substantially non-conductive coating and the metal nitride of the conductive coating can be different.

In still additional embodiments, the devices described herein can further contain an oxide layer. Such oxide layers are commonly used in the electronics industry. For example, the devices described herein can be overcoated with a silicon oxide or aluminum oxide layer, if desired, to provide an additional layer of protection and to make the devices amenable to further electronic component assembly. In some embodiments, the oxide layer can be deposited on the substantially non-conductive coating of metal nitride. In other embodiments, the oxide layer can be deposited on the conductive coating of metal nitride, if present. Specifically, the oxide layer can overcoat the substantially non-conductive coating or the conductive coating.

In some embodiments, the devices described herein can further contain at least one dummy electrical interconnect or electronic component. In some embodiments, the at least one dummy electrical interconnect or electronic component can lack a carbon nanomaterial. In some embodiments, the at least one dummy electrical interconnect or electronic component can also be coated with the substantially non-conductive coating that coats the carbon nanomaterial (e.g., in "live" electrical interconnects). In some embodiments, the substantially non-conductive coating on the at least one dummy electrical interconnect or electronic component can also have a conductive coating disposed thereon, where the conductive coating contains at least one conductive metal nitride layer.

In some embodiments, a dummy electrical interconnect can include a first electrode terminal and a second electrode terminal where there is no carbon nanomaterial providing an electrical connection between the two. When observed in a device of the present embodiments, such an electrical interconnect would accordingly appear to be in an OFF state. However, an observer would have no way to easily distinguish between a dummy electrical interconnect and a true OFF state of a live electrical interconnect, since any carbon nanomaterials present are effectively obscured by the substantially non-conductive coating of metal nitride. In other embodiments, a dummy electrical interconnect can include multiple electronic components that are interlinked with a conductive carbon nanomaterial trace. Without a means to effectively locate carbon nanomaterials in the present devices, an observer would have no way to determine the true nature of the electrical connection between the electronic components or if they are even connected at all.

In some embodiments, the electrical interconnect containing a carbon nanomaterial, the metal nitride coating, or both can be patterned by standard semiconductor processing techniques. For example, standard photoresist masking and oxygen plasma etching can be used for patterning. During patterning, the oxygen plasma can convert the initially conductive metal nitride into a substantially non-conductive state.

Figure 1:
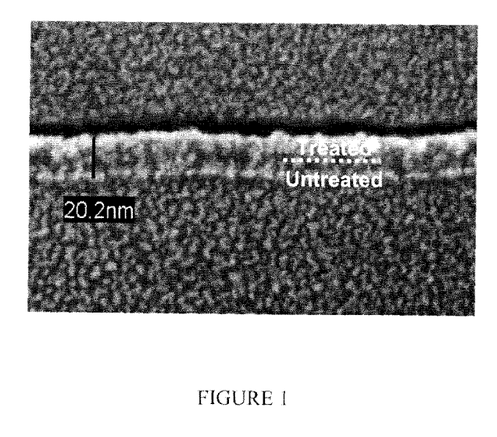
FIG. 1 shows an illustrative SEM image of a titanium nitride coating deposited by thermal chemical vapor deposition, where lower portions of the coating have not been treated to remove carbon and upper portions have been treated to remove carbon.

Embodiments of the devices presented herein will now be described in further detail with reference to the drawings. FIG. 1 shows an illustrative SEM image of a titanium nitride coating deposited by thermal chemical vapor deposition, where lower portions of the coating have not been treated to remove carbon and upper portions have been treated to remove carbon (e.g., with a hydrogen plasma). As can be seen in FIG. 1, the untreated regions of the titanium nitride coating are darker, which can be indicative of the presence of carbon residues. The treated regions of the titanium nitride coating are lighter, which can be indicative of reduced amounts of carbon relative to the untreated regions. The titanium nitride coating shown in FIG. 1 can be considered to be a single coating with a gradient distribution of carbon therein. In the alternative, the titanium nitride coating shown in FIG. 1 can be considered to contain two coatings upon one another, where the lower coating is substantially enriched in carbon and is substantially non-conductive, and the upper coating is relatively depleted in carbon such that it maintains a high conductivity state.

Figure 2A:
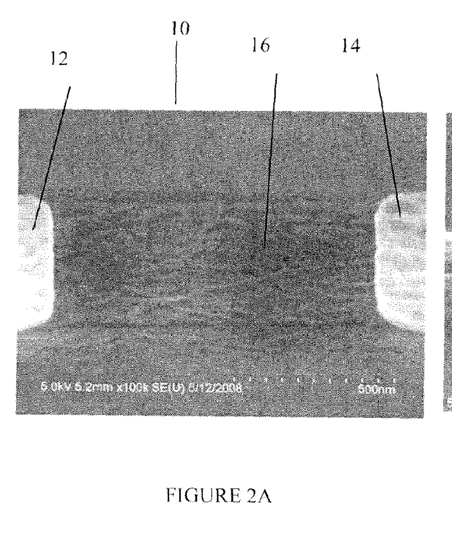
FIG. 2A shows an illustrative SEM image of a titanium nitride coating deposited on carbon nanotubes of an electrical interconnect within a two-terminal electrical device.
Figure 2B:
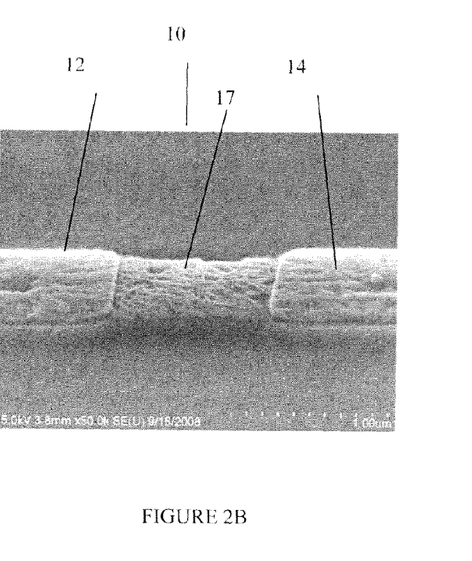
FIG. 2B shows an illustrative SEM image of the two-terminal electrical device of FIG. 2A after etching of the titanium nitride coating.

FIG. 2A shows an illustrative SEM image of a titanium nitride coating deposited on carbon nanotubes of an electrical interconnect within a two-terminal electrical device. Two-terminal device 10 shown in FIG. 2A contains electrodes 12 and 14 and a substantially non-conductive titanium nitride coating 16 located between the electrodes. The presence or absence of a carbon nanomaterial between electrodes 12 and 14 cannot be visually or spectroscopically determined due to the presence of titanium nitride coating 16. FIG. 2B shows an illustrative SEM image of the two-terminal electrical device of FIG. 2A after etching of titanium nitride coating 16, which reveals the presence of carbon nanotubes 17. If two-terminal device 10 of FIG. 2A had contained a dummy electrical interconnect, the carbon nanotubes would have been absent, but its outward appearance would have been identical.

Figure 3A:
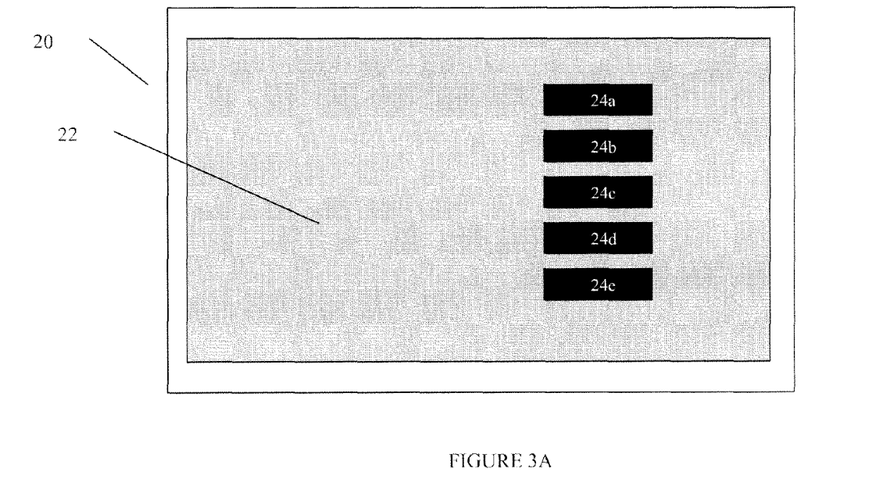
FIG. 3A shows a schematic of an illustrative electrical device containing various electronic components and a substantially non-conductive metal nitride coating.
Figure 3B:
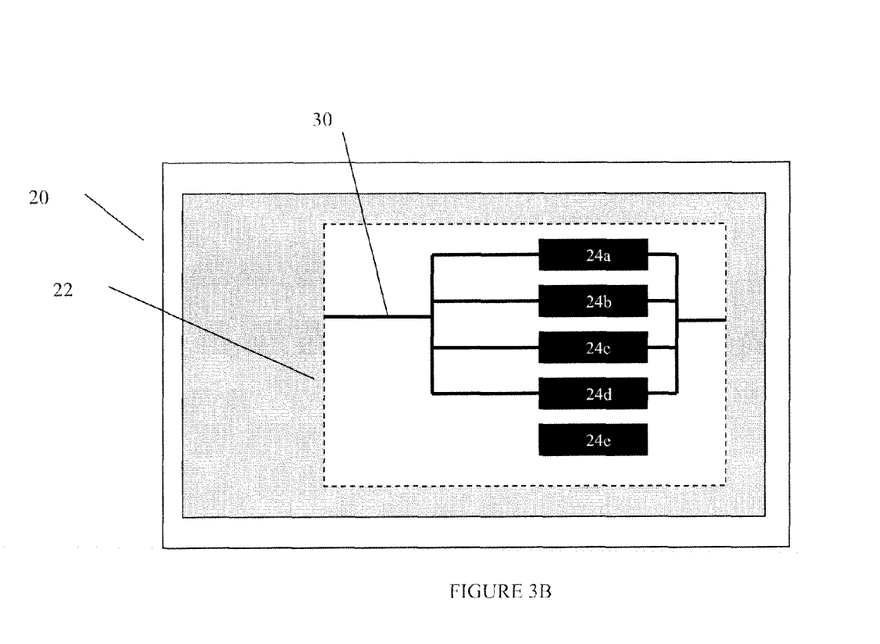
FIGS. 3B-3D show schematics of the illustrative electrical device of FIG. 3A with a portion of the substantially non-conductive metal nitride coating removed to show the positioning of carbon nanoma erial electrical interconnects therein.
Figure 3C:
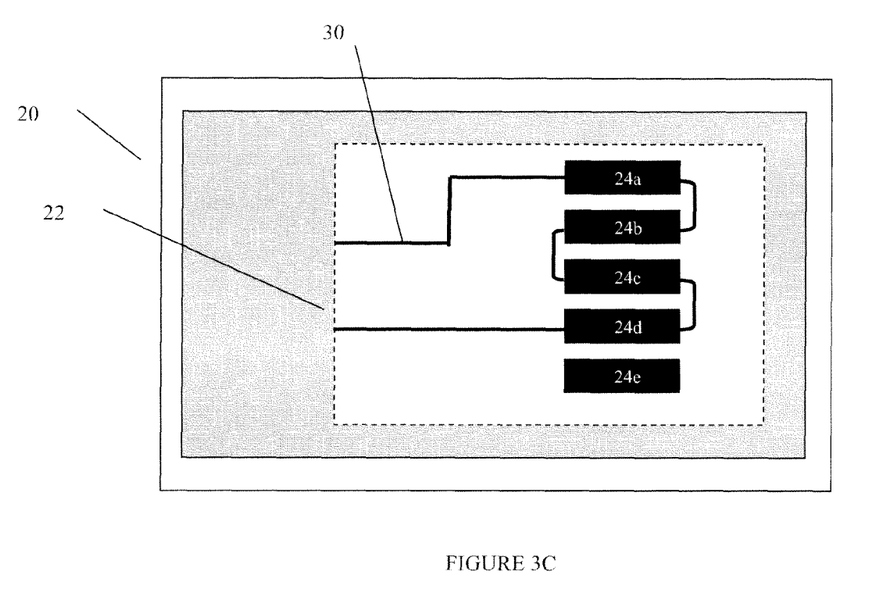
Figure 3D:
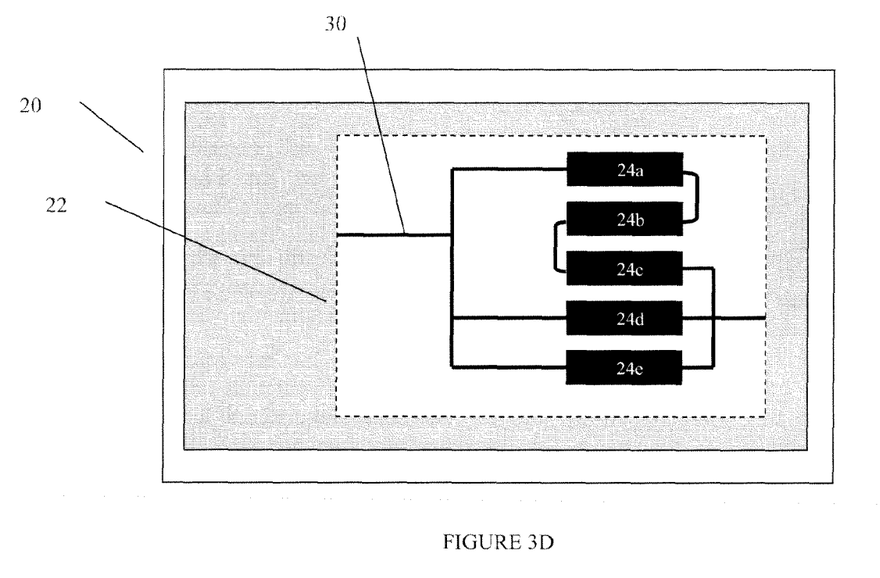

FIG. 3A shows a schematic of an illustrative electrical device containing various electronic components and a substantially non-conductive metal nitride coating. In electrical device 20, substantially non-conductive metal nitride coating 22 can prevent carbon nanomaterial interconnects, if any, and the true connectivity between electronic components 24a, 24b, 24c, 24d, and 24e from being observed. FIGS. 3B-3D show schematics of the illustrative electrical device of FIG. 3A with a portion of the substantially non-conductive metal nitride coating removed to show the positioning of carbon nanomaterial electrical interconnects therein. As shown in FIG. 3B, carbon nanomaterial electrical interconnect 30 links electronic components 24a, 24b, 24c, and 24d in parallel, and electronic component 24e is bypassed altogether. Electronic component 24e can be an operable electronic component, or it can be an inoperative dummy component, if desired. In FIG. 3C, electronic components 24a, 24b, 24c, and 24d are linked in series, and electronic component 24e is bypassed altogether. In FIG. 3D, electronic components 24a, 24b, and 24c are linked in series, which are linked in parallel to electronic components 24d and 24e. Again, the electrical interconnect patterns of FIGS. 3B-3D are indistinguishable in the presence of the substantially non-conductive coating of metal nitride. The foregoing types of electrical connections should be considered illustrative in nature only and non-limiting. As one of ordinary skill in the art will recognize, any number of electrical interconnects and electronic components can be present.

Figure 4A:
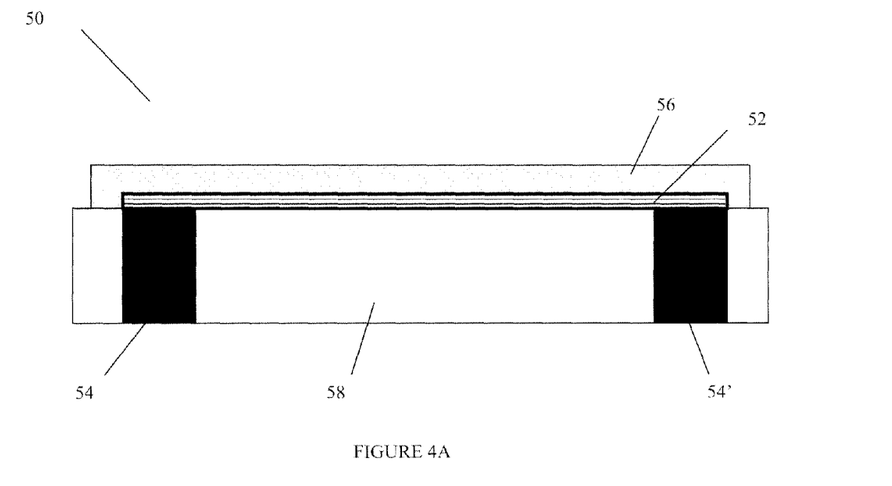
FIG. 4A shows a side view schematic of an illustrative two-terminal electrical device containing a carbon nanomaterial interconnect between two electrode terminals, where a substantially non-conductive metal nitride coating overcoats the carbon nanomaterial within the interconnect.

FIG. 4A shows a side view schematic of an illustrative two-terminal electrical device 50 containing a carbon nanomaterial interconnect 52 between electrode terminals 54 and 54', where a substantially non-conductive metal nitride coating 56 overcoats the carbon nanomaterial within carbon nanomaterial interconnect 52. Electrode terminals 54 and 54' are patterned in a non-conductive substrate 58, which is most typically oxide layer. When substantially non-conductive metal nitride coating 56 is present, an observer can be prevented from determining if electrical device 50 is simply in an OFF state or lacks carbon nanomaterials altogether.

Figure 4B:
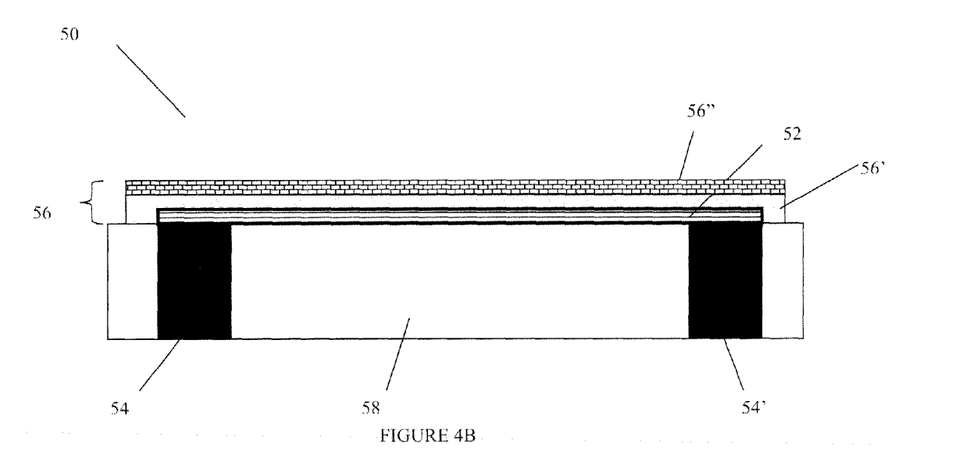
FIG. 4B shows a side view schematic of the electrical device of FIG. 4A, with the exception that a portion of the metal nitride coating has had at least some carbon removed therefrom.

FIG. 4B shows a side view schematic of the electrical device of FIG. 4A, with the exception that a portion of the metal nitride coating has had at least some carbon removed therefrom. In the embodiment depicted in FIG. 4B, metal nitride coating 56 contains a substantially non-conductive, carbon-enriched portion 56' and a conductive, carbon depleted region 56".

Figure 4C:
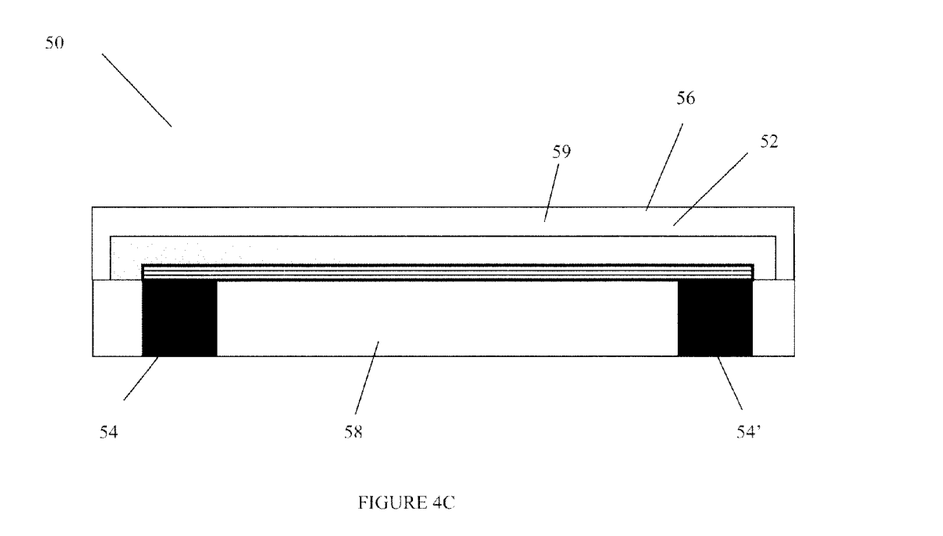
FIG. 4C shows a side view schematic of the electrical device of FIG. 4A overcoated with an optional oxide layer.
Figure 4D:
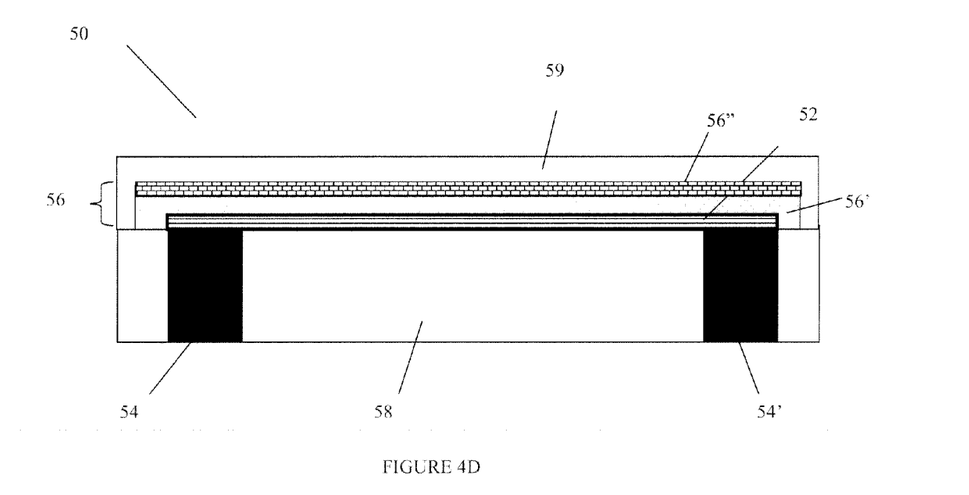
FIG. 4D shows a side view schematic of the electrical device of FIG. 4B overcoated with an optional oxide layer.

In some embodiments, an oxide layer can overcoat the metal nitride coating, where the metal nitride coating can be a substantially non-conductive metal nitride coating or a hybrid coating containing a lower portion that is substantially non-conductive and an upper portion that is conductive. FIG. 4C shows the electrical device of FIG. 4A overcoated with optional oxide layer 59, and FIG. 4D shows the electrical device of FIG. 4B overcoated with optional oxide layer 59.

Figure 5A:
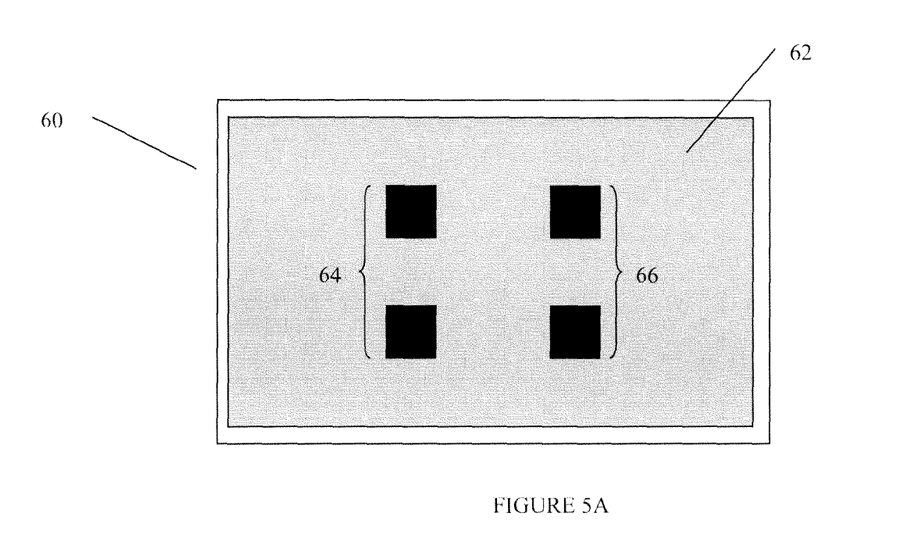
FIG. 5A shows a top view schematic of an illustrative electrical device containing a live two-terminal electrical device and a dummy two-terminal device with a substantially non-conductive metal nitride coating on each.
Figure 5B:
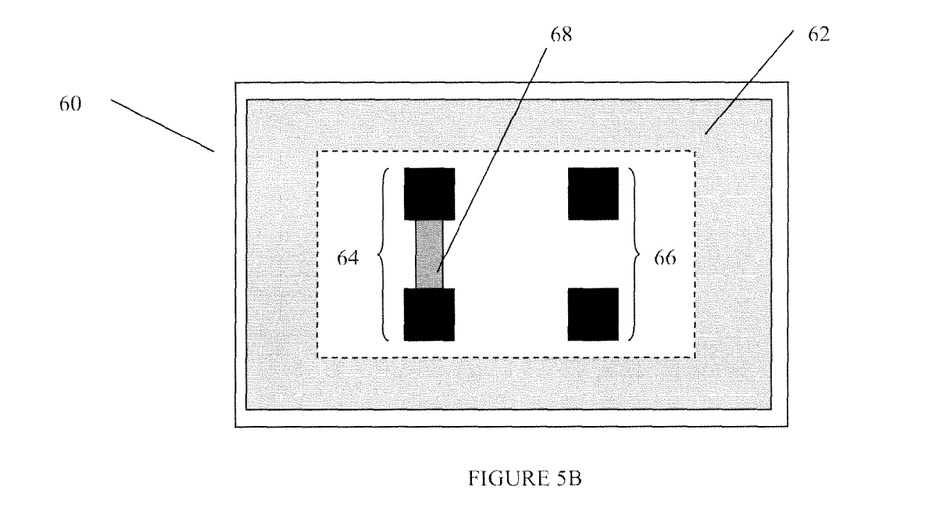
FIG. 5B shows a top view schematic of the illustrative electrical device of FIG. 5A, where a portion of the metal nitride coating has been removed to reveal the presence of carbon nanomaterial electrical interconnects.

FIG. 5A shows a top view schematic of an illustrative electrical device containing a live two-terminal electrical device and a dummy two-terminal device with a metal nitride coating on each. In FIG. 5A, device 60 contains live two-terminal electrical device 64 containing an obscured carbon nanomaterial interconnect between the electrode terminals and dummy two-terminal device 66 lacking a carbon nanomaterial interconnect between the electrode terminals. Substantially non-conductive metal nitride coating 62 overcoats the putative electrical interconnect regions between the electrodes, thus obscuring the presence or absence of carbon nanomaterials to an observer. In the device of FIG. 5A, dummy two-terminal device 66 appears to an observer to always be in an OFF state. Without the ability to confirm the presence or absence of carbon nanomaterials, an observer has no effective way to determine if the OFF state is simply the normal operational state of the device or if the device is purposefully inoperative. FIG. 5B shows a top view schematic of the illustrative device of FIG. 5A, where a portion of metal nitride coating 62 has been removed to reveal the presence of carbon nanomaterial electrical interconnect 68 between the electrode terminals of live two-terminal device 64 but not in dummy two-terminal device 66.

In some embodiments, methods for making an electrical device containing a substantially non-conductive metal nitride coating are described herein. As described hereinabove, any metal nitride coating that is substantially non-conductive and contains at least some carbon can be used. Additionally, other materials that have like properties can be used as well.

In some embodiments, the methods for making an electrical device can include providing a device containing an electrical interconnect that contains a carbon nanomaterial, depositing a first conductive coating on the carbon nanomaterial, and exposing the first conductive coating to an oxidative environment for a sufficient length of time to form a substantially non-conductive coating. The first conductive coating contains at least one conductive metal nitride layer and at least some carbon, and the substantially non-conductive coating still contains at least some carbon.

In some embodiments, the devices can further contain at least one dummy electrical interconnect. In some embodiments, the at least one dummy electrical interconnect can lack a carbon nanomaterial. In embodiments in which the at least one dummy electrical interconnect is present, the substantially non-conductive coating can also be deposited on the at least one dummy electrical interconnect.

In some embodiments, the carbon nanomaterial of the electrical interconnect can be disposed between a first electrode and a second electrode. In such embodiments, the carbon nanomaterial can be cycled between a high conductivity ON state and a low conductivity OFF state through application of voltage pulses of an appropriate magnitude. In such embodiments, the device can constitute a switch or a memory bit. In some or other embodiments, the carbon nanomaterial of the electrical interconnect can be deposited as a conductive trace connecting two or more electronic components to one another.

Any suitable technique can be used for depositing the first conductive coating. In some embodiments, the first conductive coating can be deposited by thermal chemical vapor deposition of a metal-organic precursor. As one of ordinary skill in the art will recognize, such thermal chemical vapor deposition processes can leave behind carbon residues in the deposited coating. Accordingly, one of ordinary skill in the art will be able to select from a wide array of thermal chemical vapor deposition techniques and metal-organic precursors to practice the present embodiments. For example, in embodiments in which the first conductive coating contains titanium nitride, a metal-organic precursor such as, for example, TDMAT or TDEAT can be used for deposition. In the event that the chosen deposition technique does not leave behind sufficient carbon residues in the first conductive coating, a separate doping step can optionally be performed to introduce the carbon after formation of the coating.

As discussed hereinabove, initially conductive metal nitride coatings, particularly titanium nitride, can revert to a substantially non-conductive state, if the as-deposited coating is not treated to remove at least some of the carbon residues. In some embodiments, ambient atmospheric conditions can be used as the oxidative environment for converting the first conductive coating of metal nitride into a substantially non-conductive coating. Depending on factors such as the thickness of the coating, for example, a sufficient length of time for the first conductive coating to be converted into a substantially non-conductive coating can range from about 12 hours to about 96 hours, more typically from about 24 hours to about 72 hours.

In some embodiments, it can be more desirable to accelerate the rate at which the first conductive coating of metal nitride is converted into a substantially non-conductive coating. In some embodiments, an oxygen plasma can be used as the oxidative environment. Exposure to an oxygen plasma can shorten the time needed to form a substantially non-conductive coating of metal nitride from days to seconds. In some embodiments, application of the oxygen plasma can take place during layer-by-layer deposition of the metal nitride of the first conductive coating. For example, a first layer of metal nitride can be deposited by thermal chemical vapor deposition, followed by application of an oxygen plasma thereafter to accelerate its conversion into a substantially non-conductive metal nitride layer. Application of the oxygen plasma can take place for a period of time ranging between about 1 second and about 1 minute, or between about 5 seconds and about 20 seconds in some embodiments. Once a substantially non-conductive metal nitride layer has been formed, the deposition process and subsequent oxygen plasma treatment can be continued until a desired coating thickness has been attained.

In some embodiments, the methods can further include depositing a second conductive coating on the substantially non-conductive coating, where the second conductive coating also contains at least one metal nitride layer. In some embodiments, the metal nitride of the substantially non-conductive coating and the metal nitride of the second conductive coating can be the same. In such embodiments, the combination of the substantially non-conductive coating and the second conductive coating can be considered to constitute a single-component coating containing a gradient or other non-uniform distribution of carbon therein. Specifically, during layer-by-layer deposition of the metal nitride coating, outer layers of the coating can be treated with a plasma to at least partially remove carbon therefrom, thereby allowing the outer regions of the coating to remain in a conductive state even after exposure to an oxidative environment. Generally, in such embodiments, at least a first deposited layer of metal nitride is not treated with the plasma to remove carbon (e.g., the metal nitride layer closest to a deposition substrate). By leaving the carbon present in at least the first deposited layer of metal nitride, sufficient carbon can remain for the metal nitride layer to become substantially non-conductive and to effectively mask the presence of a carbon nanomaterial in a device. Further, by not treating at least the first deposited metal nitride layer with a plasma that removes at least a portion of the carbon, unwanted degradation of the carbon nanomaterial can be avoided.

In other embodiments, the metal nitride of the substantially non-conductive coating and the metal nitride of the second conductive coating can be different. That is, the combination of the substantially non-conductive coating and the second conductive layer can have chemically distinct regions. For example, a substantially non-conductive coating of a first metal nitride can be deposited (e.g., through layer-by-layer deposition). Optionally, each layer of metal nitride can be treated with an oxygen plasma to accelerate its conversion to a substantially non-conductive state. Thereafter, a second conductive coating of a second metal nitride can be deposited on the substantially non-conductive coating (e.g., through layer-by-layer deposition). The metal nitride layers of the second conductive coating can be treated with a plasma to remove at least a portion of the carbon therefrom. That is, a coating having a substantially non-conductive lower region containing at least some carbon and a first metal nitride, and a conductive upper region containing a reduced amount of carbon or no carbon and a second metal nitride can be formed according to the described embodiments.

In some embodiments, the foregoing methods can further include depositing an oxide layer on either the substantially non-conductive coating of metal nitride, or the second conductive coating, if present. Illustrative oxide layers can include, for example, aluminum oxide and silicon oxide. As previously described, such oxide layers can provide additional electrical isolation and protection for the present electrical devices. Techniques for deposition of oxide layers in electronic devices will be well known to one having ordinary skill in the art and will not be described further.

More generally, in still other embodiments, the present disclosure describes methods for making a metal nitride coating having a gradient distribution of carbon therein. As previously described, such coatings can have a lower region that is substantially non-conductive and an upper region that is conductive.

In some embodiments, the methods can include performing layer-by-layer deposition of a coating on a growth substrate, where the coating is deposited by thermal chemical vapor deposition of a metal-organic precursor and contains two or more metal nitride layers and at least some carbon; treating some, but not all, of the metal nitride layers to remove at least a portion of the carbon therefrom; and exposing the coating to an oxidative environment for a sufficient length of time for any untreated layers to become substantially non-conductive. In some embodiments, at least a first metal nitride layer deposited on the growth substrate can be untreated.

Any suitable metal nitride that can be formed by a thermal chemical vapor deposition process that deposits at least some carbon can be used in various embodiments of the methods. In some embodiments, titanium nitride can be used as the metal nitride. Other suitable metal nitrides can include, for example, tantalum nitride, and tungsten nitride. As described above, in alternative embodiments, other suitable materials having like properties can be used as well.

As described hereinabove, in some embodiments, a suitable oxidative environment to convert any untreated metal nitride layers into a substantially non-conductive state can include, for example, ambient atmosphere or an oxygen plasma.

In some embodiments, a plasma treatment (e.g., a hydrogen plasma, a nitrogen plasma, or an ammonia plasma) can be used to remove at least a portion of the carbon from any metal nitride layers that are desired to be conductive.

Figure 6:
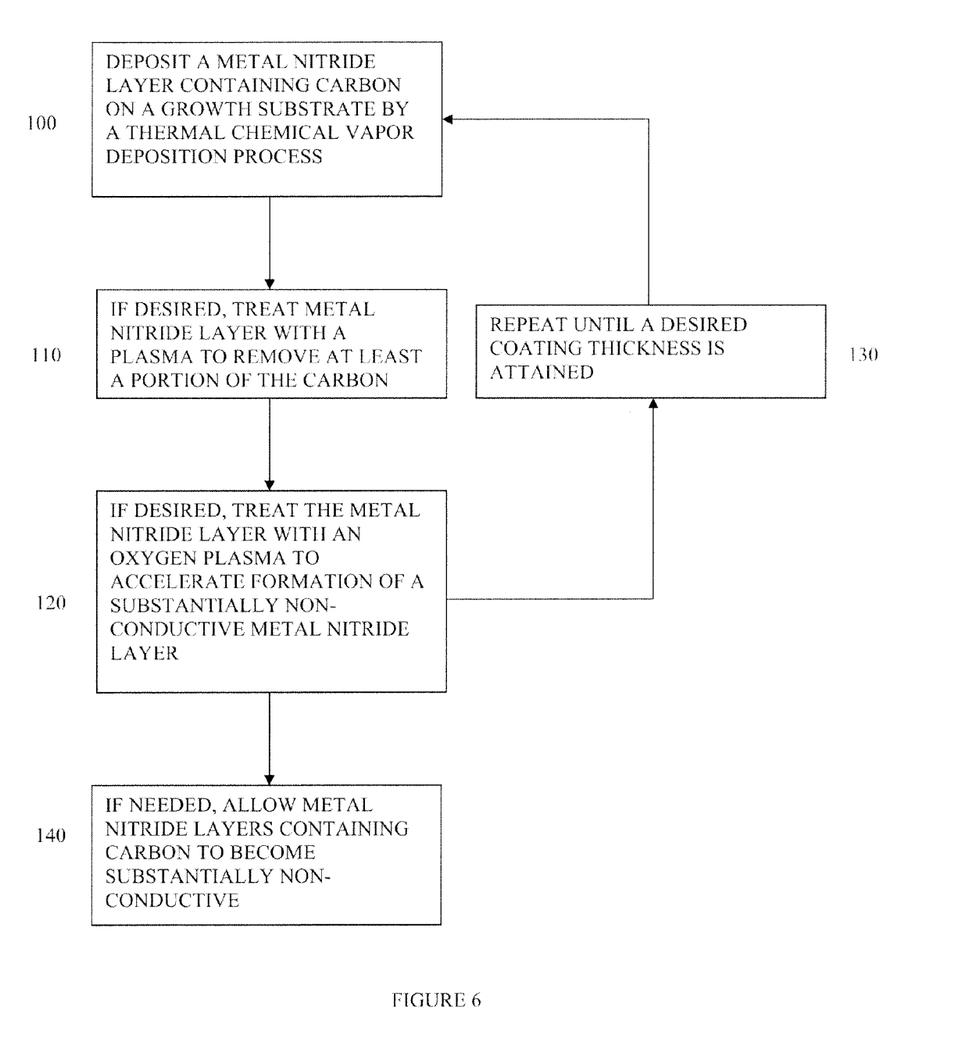
FIG. 6 shows an illustrative process for producing a metal nitride-coated substrate, where some of the metal nitride layers contain carbon and are substantially non-conductive and some of the metal nitride layers have had at least some carbon removed therefrom, thereby maintaining their conductivity.

FIG. 6 shows an illustrative process for producing a metal nitride-coated substrate, where some of the metal nitride layers contain carbon and are substantially non-conductive and some of the metal nitride layers have had at least some carbon removed therefrom, thereby maintaining their conductivity. The depicted process includes depositing a metal nitride layer containing carbon on a growth substrate via a thermal chemical vapor deposition process in operation 100. The deposited metal nitride layer can optionally be treated to remove at least a portion of the carbon in operation 110. If the metal nitride layer was untreated in operation 110, the deposited metal nitride layer can optionally be treated with an oxygen plasma in operation 120 to accelerate the formation of a substantially non-conductive metal nitride layer. At this point layer deposition can be repeated in operation 130 until a desired coating thickness is attained. That is, operations 100, 110, and 120 can be repeated to increase the coating thickness. After a desired coating thickness has been attained, any metal nitride layers containing carbon that were not previously made substantially non-conductive by oxygen plasma treatment (i.e., in operation 120), can be allowed to become substantially non-conductive.

Figure 7:
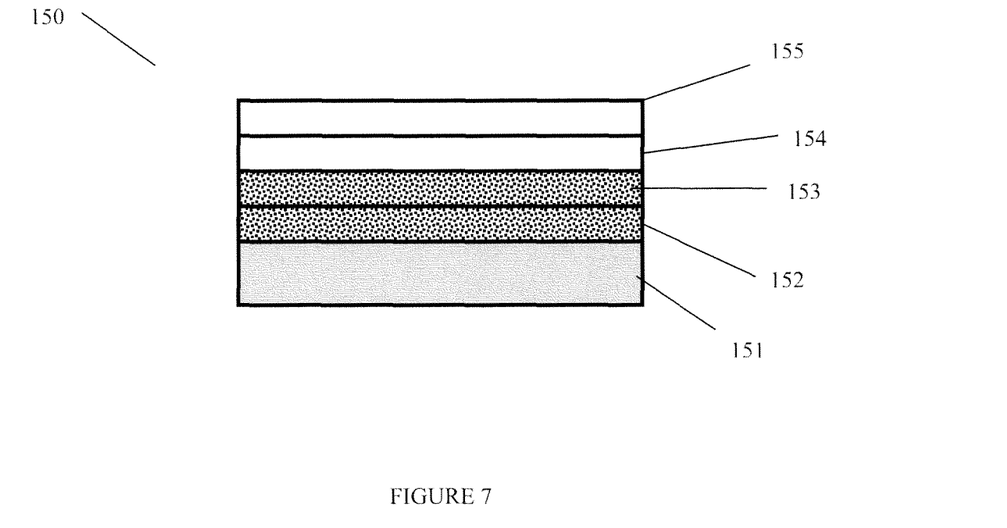
FIG. 7 shows a schematic of an illustrative metal nitride-coated substrate having one or more substantially non-conductive metal nitride layers and one or more conductive metal nitride layers.

FIG. 7 shows a schematic of an illustrative metal nitride-coated substrate 150 having one or more substantially non-conductive metal nitride layers containing carbon and one or more conductive metal nitride layers. As depicted in FIG. 7, substrate 151 has carbon-containing metal nitride layers 152 and 153 deposited thereon. Optionally, carbon-containing metal nitride layers 152 and 153 can be treated with an oxygen plasma following their deposition to accelerate their conversion into a substantially non-conductive state. Upon carbon-containing metal nitride layers 152 and 153 are deposited conductive metal nitride layers 154 and 155. Following the deposition of layers 154 and 155, the layers can be treated with a plasma (e.g., a hydrogen plasma, a nitrogen plasma, or an ammonia plasma) in order to remove at least a portion of the carbon therefrom, thereby allowing the layers to remain in a conductive state when exposed to an oxidative environment.

It is understood that modifications which do not substantially affect the activity of the various embodiments of this invention are also included within the definition of the invention provided herein. Accordingly, the following Examples are intended to illustrate but not limit the present invention.

Example 1

Layer-by-Layer Deposition of TiN Coatings

TiN coatings of approximately 200 Å thickness were prepared by sequential deposition of 2-4 TiN layers on a blanket oxide wafer. Standard thermal chemical vapor deposition techniques were used for the layer deposition, where each layer was either about 50 Å or 100 Å in thickness. As an example, a 100 Å layer of CVD TiN was deposited between 400-550° C. by flowing TDMAT and $N_2$ for 20-40 seconds. Unless indicated otherwise (e.g., for a control experiment), after depositing a layer of TiN, treatment with a hydrogen plasma was performed (e.g., at 0-750 W for 0-40 seconds) to remove at least some of the carbon from the coating. The elemental composition of the coating was analyzed thereafter by X-Ray Fluorescence (XRF). Table 1 summarizes the deposition and carbon-removal conditions and the resulting elemental composition.

TABLE 1

| Entry | # of Layers | # of $H_2$ Plasma Treatments | Sheet Resistivity (ohm/square) | XRF (kilocounts/sec) | | |
|---|---|---|---|---|---|---|
| | | | | Ti | N | C |
| Blank | — | — | — | 0.877 | 0.872 | 1.995 |
| 1 | 4 | 4 | 92.878 | 17.579 | 4.976 | 3.392 |
| 2 | 2 | 2 | 203.86 | 18.255 | 4.973 | 5.781 |
| 3 | 4 | 0 | 2631.7 | 18.533 | 4.693 | 8.491 |
| 4 | 2 | 0 | 3213.9 | 18.173 | 4.656 | 8.360 |

As shown in Table 1, plasma treatment removed a significant amount of carbon from the as-deposited TiN layers. When more plasma treatments were performed, a greater percentage of carbon was removed. A dramatic difference was observed in the sheet resistivity for the plasma-treated samples as compared to the untreated samples. Untreated samples had the highest percentage of carbon and the highest sheet resistivity. Plasma treatment lowered the sheet resistivity by over 90% relative to that of the untreated coating. A greater number of plasma treatments was more effective in removing carbon residues from the coating, and the sheet resistivity was correspondingly lower as a result. For coatings containing untreated titanium nitride (entries 3 and 4), the sheet resistivity was very high, and the carbon XRF count was greater than 8 kilocounts per second (kcps).

Figure 8:
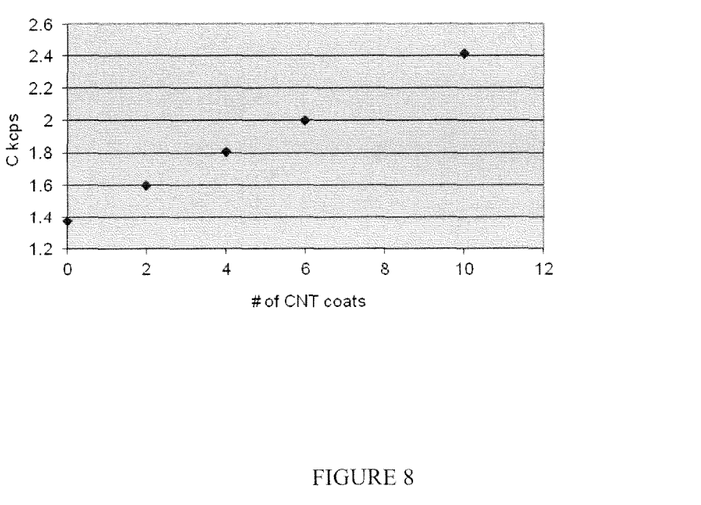
FIG. 8 shows an illustrative plot of carbon XRF count rates for deposited carbon nanotubes on a silicon dioxide substrate as a function of the number of carbon nanotube layer depositions performed.

At the carbon levels seen in entries 3 and 4, the TiN coatings can effectively conceal the presence of a carbon nanomaterial beneath the coating. FIG. 8 shows an illustrative plot of carbon XRF count rates for deposited carbon nanotubes on a silicon dioxide substrate as a function of the number of carbon nanotube layer depositions performed. As can be seen from FIG. 8, 10 layer depositions only increased the carbon XRF count by about 1 kcps relative to background (zero carbon nanotube layer depositions). At a more typical deposition value of 2 to 4 carbon nanotube layers, the increase in carbon XRF count was only 0.2 to 0.4 kcps. Unless very accurate measurement techniques are performed, this increase in carbon count can fall within the background of a untreated titanium nitride coating having a carbon count of greater than 8 kcps.

Although the invention has been described with reference to the disclosed embodiments, one having ordinary skill in the art will readily appreciate that these embodiments are only illustrative of the invention. It should be understood that various modifications can be made without departing from the spirit of the invention. The particular embodiments disclosed above are illustrative only, as the present invention may be modified and practiced in different but equivalent manners apparent to those skilled in the art having the benefit of the teachings herein. Furthermore no limitations are intended to the details of construction or design herein shown, other than as described in the claims below. It is therefore evident that the particular illustrative embodiments disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range is specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is the following:

1. A device comprising:
   an electrical interconnect comprising a carbon nanomaterial; and
   a coating on the carbon nanomaterial, the coating comprising a carbon-containing metal nitride layer that is in contact with the carbon nanomaterial and has been rendered non-conductive by exposure to an oxidative environment, and a metal nitride layer that is disposed on the carbon-containing metal nitride layer and remains conductive;
   wherein the coating comprises a gradient coating with a higher concentration of carbon nearer the carbon nanomaterial.

2. The device of claim 1, wherein the carbon nanomaterial is disposed between a first electrode and a second electrode.

3. The device of claim 1, wherein the carbon nanomaterial is selected from the group consisting of carbon nanotubes, graphene, amorphous carbon, conductive organic molecules, and any combination thereof.

4. The device of claim 1, wherein the metal nitride in the carbon-containing metal nitride layer comprises titanium nitride.

5. The device of claim 1, wherein the metal nitride in the carbon-containing metal nitride layer is selected from the group consisting of titanium nitride, tantalum nitride, tungsten nitride, and any combination thereof.

6. The device of claim 1, wherein the metal nitride of each layer is the same.

7. The device of claim 1, further comprising:
   at least one dummy electrical interconnect lacking a carbon nanomaterial;
   wherein the at least one dummy electrical interconnect is also coated with the coating that is on the carbon nanomaterial.

8. The device of claim 1, wherein the carbon-containing metal nitride layer has a thickness of at least about 100 Å.

9. The device of claim 1, wherein the carbon-containing metal nitride layer has a sheet resistivity of at least about 2000 ohms/square.

10. The device of claim 1, further comprising:
    an oxide layer overcoating the metal nitride layer that remains conductive.

11. The device of claim 1, wherein the carbon-containing metal nitride layer comprises an amount of carbon that is at least about five times that present in the carbon nanomaterial.

* * * * *